United States Patent
Pan

(10) Patent No.: US 9,991,367 B1
(45) Date of Patent: Jun. 5, 2018

(54) BIPOLAR JUNCTION TRANSISTOR

(71) Applicant: UNITED MICROELECTRONICS CORP., Hsin-Chu (TW)

(72) Inventor: Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/782,817

(22) Filed: Oct. 12, 2017

(30) Foreign Application Priority Data

Sep. 14, 2017  (TW) .............................. 106131547 A

(51) Int. Cl.
| | | |
|---|---|---|
| H01L 27/02 | (2006.01) | |
| H01L 29/73 | (2006.01) | |
| H01L 29/08 | (2006.01) | |
| H01L 27/06 | (2006.01) | |
| H01L 29/06 | (2006.01) | |
| H01L 29/66 | (2006.01) | |
| H01L 29/10 | (2006.01) | |
| H01L 29/417 | (2006.01) | |
| H01L 21/8234 | (2006.01) | |

(52) U.S. Cl.
CPC .......... *H01L 29/73* (2013.01); *H01L 27/0635* (2013.01); *H01L 29/0692* (2013.01); *H01L 29/0804* (2013.01); *H01L 29/0821* (2013.01); *H01L 29/1004* (2013.01); *H01L 29/66234* (2013.01); *H01L 21/823431* (2013.01); *H01L 29/41708* (2013.01)

(58) Field of Classification Search
CPC ........... H01L 29/41708; H01L 21/8249; H01L 29/0804; H01L 29/732
See application file for complete search history.

(56) References Cited

U.S. PATENT DOCUMENTS

| | | | | |
|---|---|---|---|---|
| 4,868,624 A | * | 9/1989 | Grung | ................. H01L 29/0692 257/273 |
| 8,610,241 B1 | | 12/2013 | Hu | |
| 8,629,420 B1 | | 1/2014 | Shrivastava | |
| 9,035,426 B2 | | 5/2015 | Chang | |
| 9,613,949 B1 | | 4/2017 | Pan | |
| 9,780,003 B2 | * | 10/2017 | Hu | ....................... H01L 21/8249 |
| 2002/0000640 A1 | * | 1/2002 | Zhu | ..................... H01L 29/0821 257/565 |
| 2013/0168819 A1 | * | 7/2013 | Chang | ................... H01L 29/735 257/565 |
| 2015/0123246 A1 | * | 5/2015 | Hu | ...................... H01L 21/8249 257/584 |
| 2015/0236116 A1 | * | 8/2015 | Chang | ................. H01L 29/6625 438/338 |
| 2018/0068998 A1 | * | 3/2018 | Wang | .................... H01L 27/082 |

OTHER PUBLICATIONS

Hsueh, "Device Challenges for Scaled Analog—RF", 2017.

* cited by examiner

*Primary Examiner* — Jaehwan Oh
(74) *Attorney, Agent, or Firm* — Winston Hsu

(57) ABSTRACT

A bipolar junction transistor (BJT) includes an emitter region, a base region surrounding the emitter region, and a collector region surrounding the base region. The emitter region includes a fin structures extending along a first direction, a first metal gate extending across the fin structure along a second direction, and a second metal gate disposed in parallel with the first metal gate. A spacing between the first metal gate and the second metal gate ranges between 0.2 micrometers and 0.4 micrometers.

20 Claims, 2 Drawing Sheets

BIPOLAR JUNCTION TRANSISTOR

CROSS REFERENCE TO RELATED APPLICATION

This application claims the benefit of Taiwan patent application No. 106131547, filed on Sep. 14, 2017, the disclosure of which is incorporated herein in its entirety by reference.

BACKGROUND OF THE INVENTION

1. Field of the Invention

The present invention relates to the field of semiconductor technology, and in particular to a bipolar junction transistor (BJT).

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demand of products. However, with the increasing miniaturization of electronic products, current planar field effect transistors (FETs) no longer meet the requirements of the products. Thus, there is a development for non-planar FETs such as Fin-FETs to achieve a high drive current and to lessen the short channel effect.

However, integrated circuit (IC) devices including complementary metal oxide semiconductor CMOS FinFETs also require other semiconductor structures and transistors, such as diodes and bipolar junction transistors (BJTs). These other semiconductor structures and transistors are formed alongside and concurrently with the FinFETs using the same materials and processes preferably. Because the Fin-FET basically has a three-dimensional structure, the forming method thereof is more complicated than that of the traditional structure, and it is difficult to integrate Fin-FET forming method into conventional planar FET forming method and the method of forming other semiconductor structures and transistors.

SUMMARY OF THE INVENTION

The main object of the present invention is to provide an improved bipolar junction transistor which can solve the disadvantages and shortcomings of the prior art.

According to one embodiment, a bipolar junction transistor (BJT) includes an emitter region comprising at least one fin structure extending along a first direction on a substrate, a first metal gate extending across the at least one fin structure along a second direction, and a second metal gate disposed in parallel with the first metal gate. A spacing between the first metal gate and the second metal gate ranges between 0.2 micrometers and 0.4 micrometers. A base region surrounds the emitter region. A collector region surrounds the base region.

A third metal gate is disposed in parallel with the first metal gate and strides across the at least one fin structure along the second direction. A spacing between the first metal gate and the third metal gate ranges between 0.2 micrometers and 0.4 micrometers. A first epitaxial layer is disposed between the first metal gate and the second metal gate, and a second epitaxial layer is disposed between the first metal gate and the third metal gate.

According to another embodiment, a bipolar junction transistor (BJT) includes a substrate and an emitter region on the substrate. The emitter region comprises at least one fin structure extending along a first direction, a first metal gate extending across the at least one fin structure along a second direction, and a second metal gate disposed in parallel with the first metal gate. An inter-layer dielectric (ILD) layer is disposed around the first metal gate and the second metal gate. A local contact plug is disposed in the ILD layer. The local contact plug elongates along the first direction and completely overlaps with the at least one fin structure between the first metal gate and the second metal gate. A base region is disposed on the substrate and surrounds the emitter region. A collector region is disposed on the substrate and surrounds the base region.

A third metal gate is disposed in parallel with the first metal gate and extends across the at least one fin structure along the second direction. A spacing between the first metal gate and the third metal gate ranges between 0.2 micrometers and 0.4 micrometers. A spacing between the first metal gate and the second metal gate ranges between 0.2 micrometers and 0.4 micrometers.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
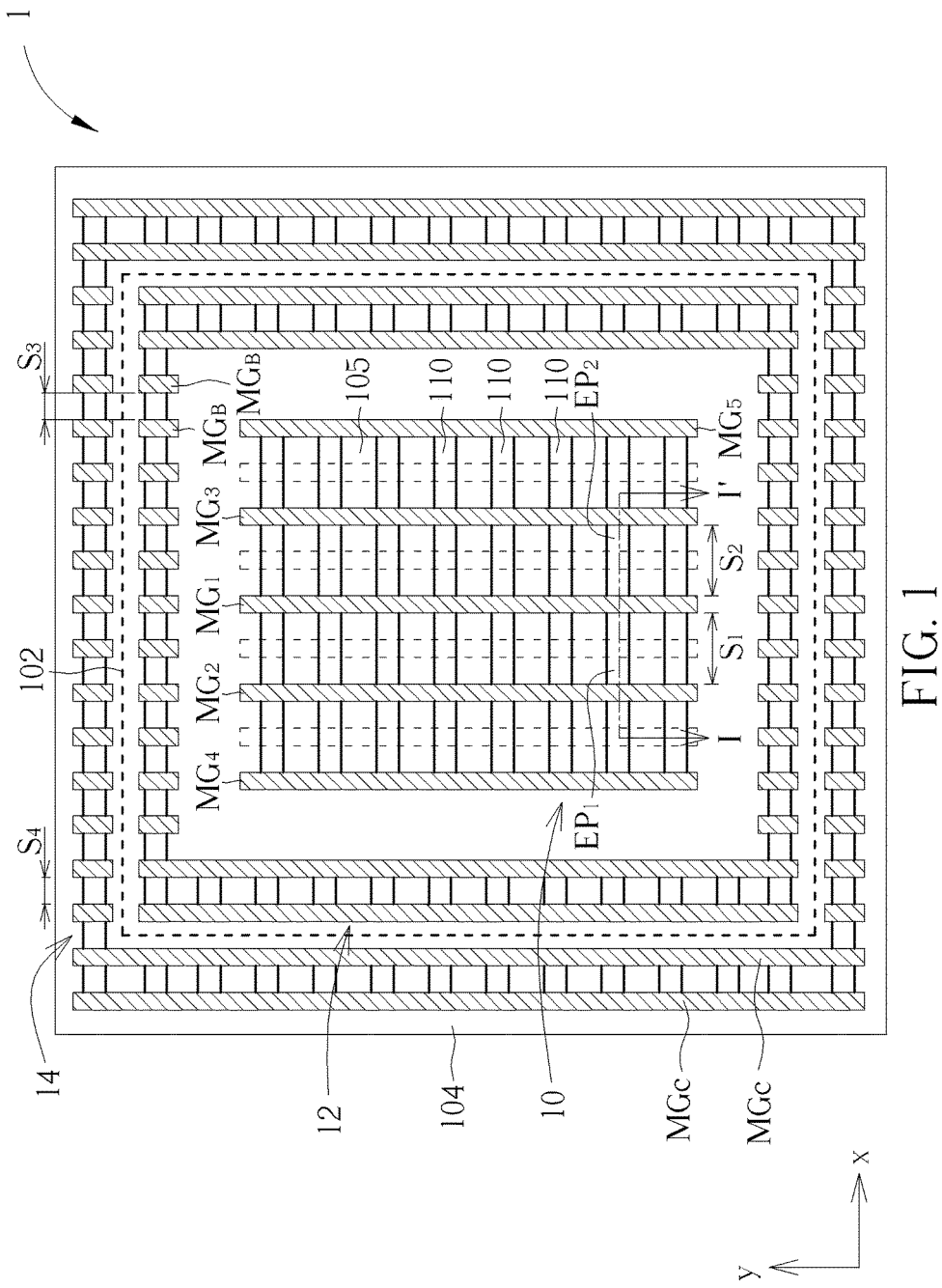
FIG. 1 is a schematic top view of a bipolar junction transistor according to an embodiment of the present invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

The present invention discloses a bipolar junction transistor. Applicant has found that the conversion from a planar bipolar junction transistor into a bipolar junction transistor containing a fin structure requires electrical improvements. For example, for the bipolar junction transistor containing a fin structure fabricated by 14 nm process, the collector current ($I_c$) becomes less uniform because of the SiP epitaxial layer between the metal gate and the metal gate in the emitter area.

In the future, if 7-nm or a more advanced process is used to fabricate a bipolar junction transistor with a fin structure, the gap or spacing between the metal gates in the emitter region will be more miniaturized and the overall effective collector area will become smaller. The reduced contact area of the $M_0$ contact plug will cause the collector current ($I_c$) path to be more concentrated below the $M_0$ contact plug, which is not conducive to the electrical performance of the bipolar junction transistor. The present invention provides a solution to this problem.

Figure 2:
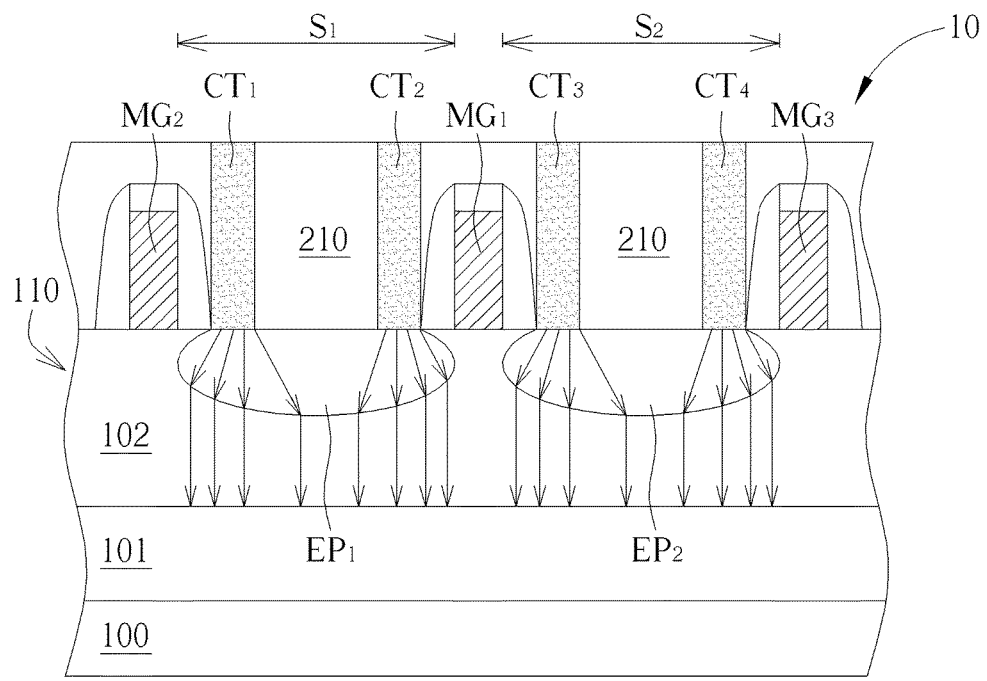
FIG. 2 is a schematic cross-sectional view of a portion of the emitter region taken along line I-I' in FIG. 1.

Referring to FIGS. 1 and 2, in which FIG. 1 is a schematic top view of a bipolar junction transistor according to an embodiment of the present invention, and FIG. 2 is a schematic cross-sectional view of a portion of the emitter region taken along line I-I' in FIG. 1. As shown in FIG. 1, the bipolar junction transistor 1 comprises a substrate 100, such as a semiconductor substrate or a silicon substrate, but is not limited thereto. According to an embodiment of the present invention, the substrate 100 has a first conductivity type, for example, a P-type. It is to be understood that although the NPN type bipolar junction transistor is described as an example, the skilled artisan should be able to apply the disclosed embodiments directly or indirectly to a PNP type bipolar Interface transistor.

According to an embodiment of the present invention, an emitter region 10 is provided on the substrate 100 and includes a plurality of fin structures 110 extending in a first direction (e.g., reference coordinate x-axis direction). According to an embodiment of the present invention, the fin structures 110 are insulated from each other by a shallow trench isolation (STI) structure 105. The fin structures 110 protrude from the top surface of the STI structure 105. An annular base region 12 is provided on the substrate 100. The base region 12 surrounds the emitter region 10. An annular collector region 14 is provided on the substrate 100. The collector region 14 surrounds the base region 12.

According to an embodiment of the present invention, the substrate 100 is provided with a first ion well 102 having the first conductivity type. For example, the first ion well 102 is a P-type well. The emitter region 10 and the base region 12 are disposed in the first ion well 102. According to an embodiment of the present invention, the collector region 14 is provided in a second ion well 104. The second ion well 104 surrounds the first ion well 102 and have a second conductivity type. For example, a second ion well 104 is an N-type well.

According to an embodiment of the present invention, the bipolar junction transistor 1 further comprises a deep ion well 101 having the second conductivity type. For example, the deep ion well 101 is a deep N-well and is disposed under the first ion well 102 and the second ion well 104. The second ion well 104 and the deep ion well 101 collectively encloses the first ion well 102 to electrically isolate the first ion well 102 from the substrate 100.

According to an embodiment of the present invention, the emitter region 10 further comprises metal gates, for example, $MG_1$ to $MG_5$, which stride across the fin structures 110 in a second direction (e.g., reference coordinate y-axis direction). It is to be understood that the number of metal gates shown in the figures is illustrative only. According to an embodiment of the present invention, the first direction is orthogonal to the second direction.

According to an embodiment of the present invention, the plurality of metal gates in the emitter region 10 comprise a first metal gate $MG_1$ which strides across the fin structures 110 in the second direction, a second metal gate $MG_2$ in parallel to the first metal gate $MG_1$, and a third metal gate $MG_3$ in parallel to the first metal gate $MG_1$, and strides across the fin structures 110 in the second direction. The first metal gate $MG_1$ is interposed between the second metal gate $MG_2$ and the third metal gate $MG_3$.

According to an embodiment of the present invention, as shown in FIG. 2, a spacing $S_1$ between the first metal gate $MG_1$ and the second metal gate $MG_2$ ranges between 0.2 µm and 0.4 µm, and a spacing $S_2$ between the first metal gate $MG_1$ and the third metal gate $MG_3$ ranges between 0.2 µm and 0.4 µm. According to an embodiment of the present invention, the spacing $S_1$ is equal to the spacing $S_2$.

According to an embodiment of the present invention, as shown in the FIG. 1, the annular base region 12 is provided with a plurality of metal gates $MG_B$ extending along the second direction, and a spacing $S_3$ between the metal gates $MG_B$ ranges between 0.1 µm and 0.2 µm. The annular collector region 14 is provided with a plurality of metal gates $MG_C$ extending along the second direction, and a spacing $S_4$ between the metal gates $MG_C$ ranges between 0.1 µm and 0.2 µm. According to an embodiment of the present invention, the spacing $S_3$ is approximately equal to the spacing $S_4$ and is smaller than the $S_1$ and $S_2$.

According to an embodiment of the present invention, the metal gates $MG_1$ to $MG_5$, the metal gate $MG_B$ and the metal gate $MG_C$ shown in FIGS. 1 and 2 are dummy metal gates. That is, during operation, these dummy metal gates will not be applied with any voltage. The metal gate $MG_1$~$MG_5$, the metal gate $MG_B$, and the metal gate $MG_C$ can be fabricated by known metal gate processes, for example, replacement metal gate (RMG) processes. The structure of each metal gate may include an interfacial dielectric layer, a high dielectric constant (high-k) dielectric layer, a barrier layer, a work function layer, or a cap layer. As the metal gate processes are well-known in the art, the details of which are omitted.

According to an embodiment of the present invention, as shown in FIG. 2, a first epitaxial layer $EP_1$ is provided between the first metal gate $MG_1$ and the second metal gate $MG_2$, and a second epitaxial layer $EP_2$ is provided between the first metal gate $MG_1$ and the third metal gate $MG_3$. According to an embodiment of the present invention, taking an NPN bipolar junction transistor as an example, the first epitaxial layer $EP_1$ and the second epitaxial layer $EP_2$ are SiP epitaxial layers. According to another embodiment of the present invention, taking PNP bipolar junction transistor as an example, the first epitaxial layer $EP_1$ and the second epitaxial layer $EP_2$ are SiGe epitaxial layers.

According to an embodiment of the present invention, as shown in FIG. 2, the bipolar junction transistor 1 further comprises an interlayer dielectric layer 210, such as a silicon oxide layer, disposed around the first metal gate $MG_1$, the second metal gate $MG_2$ and the third metal gate $MG_3$. The interlayer dielectric layer 210 covers the first metal gate $MG_1$, the second metal gate $MG_2$, and the third metal gate $MG_3$.

According to an embodiment of the present invention, as shown in FIG. 2, a plurality of contact plugs $CT_1$ to $CT_4$ are provided in the interlayer dielectric layer 210. The contact plug $CT_1$ and the contact plug $CT_2$ are in direct contact with the first epitaxial layer $EP_1$. The contact plug $CT_1$ is kept at a distance, for example, about a width of a metal gate, from the contact plug $CT_2$. The contact plug $CT_3$ and the contact plug $CT_4$ are in direct contact with the second epitaxial layer $EP_2$. The contact plug $CT_3$ is kept at a distance, for example, approximately the width of a metal gate, from the contact plug $CT_4$. The advantages of this approach include: (1) the overall effective collector area can be increased; (2) collector current ($I_c$) through the contact plug $CT_1$ and contact plug $CT_2$ into the first epitaxial layer $EP_1$ can be more uniform.

The contact plugs $CT_1$ to $CT_4$ may be a cylindrical plug or a slot contact plug extending across the fin structures 110 in the second direction. In addition, the number of contact plugs may be adjusted as required, not limited to those illustrated in FIG. 2, for example, one or more contact plugs may be added between the contact plug $CT_1$ and the contact plug $CT_2$ to further improve the uniformity of the collector current distribution.

According to an embodiment of the present invention, the contact plugs $CT_1$ to $CT_4$ are made of a $M_0$ metal layer, and may include, for example, a TiN barrier layer and a tungsten layer, but are not limited thereto. Other layers of metal layers such as $M_1$ and $M_2$, or other interconnect structure, may be used to form the circuit signal path.

Figure 3:
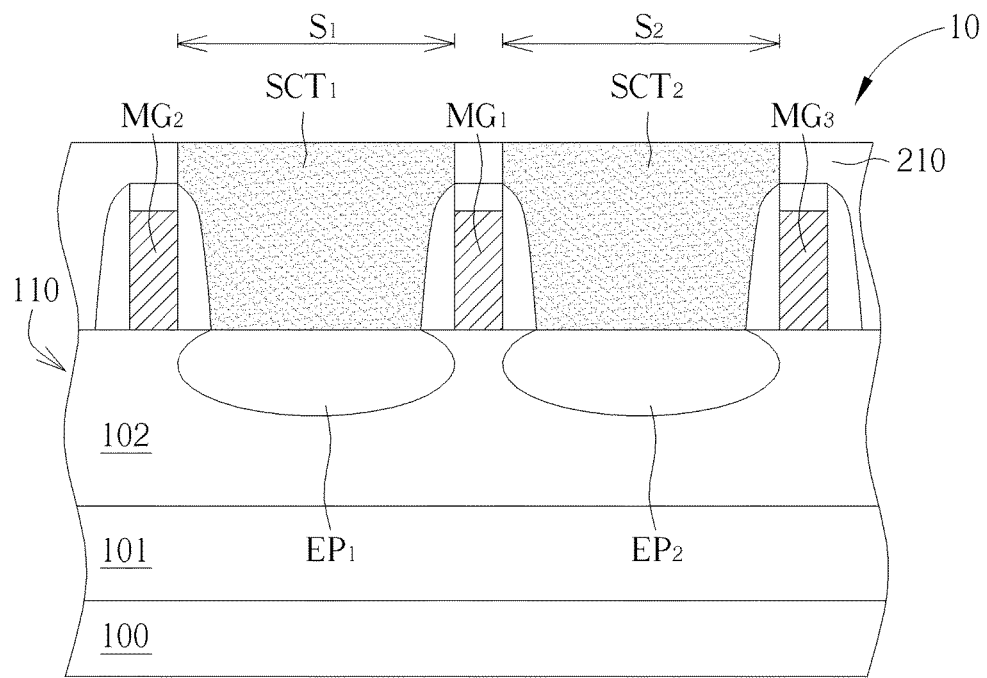
FIG. 3 is a schematic cross-sectional view of the emitter region depicted in accordance with another embodiment of the present invention.

FIG. 3 is a schematic cross-sectional view of the emitter region depicted in accordance with another embodiment of the present invention. As shown in FIG. 3, according to another embodiment of the present invention, the local contact plugs $SCT_1$ and $SCT_2$ may be provided in the interlayer dielectric layer 210. The local contact plugs $SCT_1$ and $SCT_2$ may be slot contact plugs extending along the first direction, and may be completely overlapped with the fin structures 110 between the first metal gate $MG_1$ and the second metal gate $MG_2$ and between the first metal gate $MG_1$ and the third metal gate $MG_3$, respectively. The top surface of the first epitaxial layer $EP_1$ is completely covered by the local contact plug $SCT_1$, and the top surface of the second epitaxial layer $EP_2$ is completely covered by the local contact plug $SCT_2$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar junction transistor (BJT), comprising:
an emitter region comprising at least one fin structure extending along a first direction on a substrate, a first metal gate extending across the at least one fin structure along a second direction, and a second metal gate disposed in parallel with the first metal gate, wherein a spacing between the first metal gate and the second metal gate ranges between 0.2 micrometers and 0.4 micrometers;
a base region surrounding the emitter region; and
a collector region surrounding the base region.

2. The BJT according to claim 1, wherein a third metal gate is disposed in parallel with the first metal gate and strides across the at least one fin structure along the second direction.

3. The BJT according to claim 2, wherein a spacing between the first metal gate and the third metal gate ranges between 0.2 micrometers and 0.4 micrometers.

4. The BJT according to claim 3, wherein a first epitaxial layer is disposed between the first metal gate and the second metal gate, and a second epitaxial layer is disposed between the first metal gate and the third metal gate.

5. The BJT according to claim 4, wherein the first epitaxial layer and the second epitaxial layer are SiP layers.

6. The BJT according to claim 4, wherein the first epitaxial layer and the second epitaxial layer are SiGe layers.

7. The BJT according to claim 1, wherein the first direction is orthogonal to the second direction.

8. The BJT according to claim 1, wherein the substrate is a semiconductor substrate of a first conductivity type, a first ion well of the first conductivity type is provided in the substrate, wherein the emitter region and the base region are disposed in the first ion well.

9. The BJT according to claim 8, wherein the collector region is disposed in a second ion well of a second conductivity type surrounding the first ion well.

10. The BJT according to claim 9, wherein a deep ion well of the second conductivity type is disposed under the first ion well and the second ion well.

11. A bipolar junction transistor (BJT), comprising:
a substrate;
an emitter region on the substrate, the emitter region comprising at least one fin structure extending along a first direction, a first metal gate extending across the at least one fin structure along a second direction, and a second metal gate disposed in parallel with the first metal gate;
an inter-layer dielectric (ILD) layer around the first metal gate and the second metal gate;
a local contact plug in the ILD layer, wherein the local contact plug elongates along the first direction and completely overlaps with the at least one fin structure between the first metal gate and the second metal gate;
a base region on the substrate and surrounding the emitter region; and
a collector region on the substrate and surrounding the base region.

12. The BJT according to claim 11, wherein a third metal gate is disposed in parallel with the first metal gate and extends across the at least one fin structure along the second direction.

13. The BJT according to claim 12, wherein a spacing between the first metal gate and the third metal gate ranges between 0.2 micrometers and 0.4 micrometers, and wherein a spacing between the first metal gate and the second metal gate ranges between 0.2 micrometers and 0.4 micrometers.

14. The BJT according to claim 13, wherein a first epitaxial layer is disposed between the first metal gate and the second metal gate, and a second epitaxial layer is disposed between the first metal gate and the third metal gate.

15. The BJT according to claim 14, wherein the first epitaxial layer and the second epitaxial layer are SiP layers.

16. The BJT according to claim 14, wherein the first epitaxial layer and the second epitaxial layer are SiGe layers.

17. The BJT according to claim 11, wherein the first direction is orthogonal to the second direction.

18. The BJT according to claim 11, wherein the substrate is a semiconductor substrate of a first conductivity type, a first ion well of the first conductivity type is provided in the substrate, wherein the emitter region and the base region are disposed in the first ion well.

19. The BJT according to claim 18, wherein the collector region is disposed in a second ion well of a second conductivity type surrounding the first ion well.

20. The BJT according to claim 19, wherein a deep ion well of the second conductivity type is disposed under the first ion well and the second ion well.

* * * * *